United States Patent [19]

Fukuda et al.

[11] Patent Number: 4,869,999
[45] Date of Patent: Sep. 26, 1989

[54] METHOD OF FORMING PATTERN AND PROJECTION ALIGNER FOR CARRYING OUT THE SAME

[75] Inventors: Hiroshi Fukuda, Kokubunji; Norio Hasegawa, Tokyo; Toshihiko Tanaka, Tokyo; Toshiei Kurosaki, Kodaira, all of Japan

[73] Assignee: Hitachi, Ltd., Tokyo, Japan

[21] Appl. No.: 83,211

[22] Filed: Aug. 10, 1987

[30] Foreign Application Priority Data

Aug. 8, 1986 [JP] Japan .................. 61-185087
Sep. 5, 1986 [JP] Japan .................. 61-207835

[51] Int. Cl.$^4$ .................................. G03C 5/04
[52] U.S. Cl. ............................ 430/311; 430/394;
430/397; 430/494; 355/55
[58] Field of Search .............. 430/30, 394, 494, 311,
430/396, 397; 355/40, 55, 52

[56] References Cited

U.S. PATENT DOCUMENTS 3,798,036  3/1974  Schnepf .................. 430/394
4,239,790 12/1980  Bosenberg ............... 427/54.1

OTHER PUBLICATIONS

Paterson, "Automask: A Method to Image on Photo-sensitized 3-D Object", Motorola TDB, vol. (1)(1), Aug. 1980.

Primary Examiner—Jose G. Dees
Attorney, Agent, or Firm—Antonelli, Terry & Wands

[57] ABSTRACT

An area on a photoresist film which is formed on a substrate surface having a topography, is exposed a plurality of times in such a manner that the image plane of a mask pattern is formed at a plurality of positions which are spaced apart from a reference plane in the substrate in the direction of an optical axis, and then the photoresist film is developed to form a resist pattern. According to the above method, the effective focal depth of the projection aligner used is enhanced, and moreover the reduction of the image contrast at the photoresist film is very small by the plural exposure operations. Accordingly, a fine pattern can be formed accurately on the substrate surface having the topography.

9 Claims, 3 Drawing Sheets

METHOD OF FORMING PATTERN AND PROJECTION ALIGNER FOR CARRYING OUT THE SAME

BACKGROUND OF THE INVENTION

The present invention relates to a pattern forming method for use in fabricating a semiconductor device, a magnetic bubble device, a superconductive device and others, and a projection aligner for carrying out the method.

As is well known, a projection exposure method is widely used for forming fine patterns such as a wiring pattern in a semiconductor device and a transfer pattern in a magnetic bubble device. Specifically, a reduction projection exposure method is very useful in forming a fine pattern. In the projection exposure method, however, the depth of focus or the focal depth of an exposure optical system is greatly dependent upon the numerical aperture of a projection lens and an exposure wavelength. The focal depth of the projection lens is inversely proportional to the square of the numerical aperture thereof. When the numerical aperture is made large to improve a resolution limit, the focal depth is decreased. Thus, it is not easy to solve difficulties due to the field curvature of the projection lens and the topography of a substrate surface. A problem which arises in forming a relatively fine pattern on a substrate surface having a difference in level (that is, a topography), has hitherto been solved by smoothing the substrate surface through the well-known multi-layer resist scheme. However, it is impossible to make completely flat the topography due to a large-area pattern by the above method, and thus the image of mask pattern inevitably becomes fuzzy at the top or bottom of the topography.

The multi-layer resist method is described in, for example, the Journal of Vacuum Science and Technology, B-1(4), 1983, pages 1235 to 1240. Further, various reduction projection aligners are shown in the Semiconductor World, June, 1984, pages 110 to 114, and other publications.

Furthermore, Japanese patent application JP-A-58-17,446 discloses the following method. That is, when a fine pattern is formed on a substrate through the reduction projection exposure method, an exposure operation is performed in a state that the substrate, a mask, or an optical system vibrates in the direction of optical axis of the optical system, to reduce variations in feature size of the fine pattern.

With the recent increase in the integration density of a semiconductor integrated circuit, the pattern on a semiconductor integrated circuit is made fine, and the unevenness or difference in level (namely, the difference in height between the top and the bottom of the topography) of the substrate surface is made large. Accordingly, it is required to devise an appropriate countermove for the large unevenness or level difference. In a case where the projection exposure method is used for pattern formation, in order to form a fine pattern accurately on a substrate surface having large unevenness or a large level difference, it is necessary to make very large the focal depth of a reduction projection aligner used. However, when the numerical aperture of a projection lens is made large to improve a resolution limit, the focal depth of the aligner becomes small. Further, owing to the field curvature of the projection lens, the image plane of a mask is not a perfect plane. Accordingly, it is very difficult to form the image of a mask pattern accurately at the top and the bottom of the topography of an exposure area of a substrate surface.

Further, as has been already described, it is impossible to make completely flat the topography of a substrate surface due to a large-area pattern, by the multilayer resist method. Even if the topography is made completely flat, it will be very difficult to form a fine pattern accurately on the substrate surface, since the field curvature of a projection lens makes it impossible to make the image plane of a mask pattern coincident with the substrate surface.

Further, according to the method, in which an exposure operation is performed in a state that a substrate or a mask and an optical system vibrate in the direction of an optical axis, it is possible to form the image of a mask pattern at the top and bottom of the topography of a substrate surface. However, it has been found by the inventors' investigation that when an exposure operation is performed in a state that a substrate, a mask, or an optical system vibrates in the direction of an optical axis, the image of the mask formed on the substrate is extremely small in contrast, and thus it is very difficult to form a fine pattern very accurately by developing a photoresist film which has been irradiated in accordance with the above image. The reason for this is not clear, but it is considered that when an exposure operation is performed in a state that one of the substrate, or the mask and the optical system vibrates in the direction of the optical axis, an exposure period corresponding to the upper and lower portions of the amplitude of the vibration is far shorter than an exposure period corresponding to a central portion of the amplitude, a fuzzy image of the mask is formed strongly at the top of the topography of a substrate surface, for example, and the fuzzy image reduces the image contrast in a great degree.

SUMMARY OF THE INVENTION

An object of the present invention is to provide a pattern forming method which can solve the above-mentioned problems of the prior art and can form a fine pattern accurately on a substrate surface having a large level difference.

Another object of the present invention is to provide a pattern forming method which can form the high-contrast image of a mask pattern on a substrate surface having a large level difference.

A further object of the present invention is to provide a pattern forming method, in which even when a projection lens having a large numerical aperture is used, the effective focal depth of an optical projection system is not decreased, but the image of a mask pattern is formed accurately at the top and the bottom of the topography of a substrate surface.

In order to attain the above objects, according to the present invention, an exposure operation for exposing a photoresist film through a mask is performed successively or at the same time at different positional relations in the direction of an optical axis between the photoresist film and the image plane of a mask pattern (that is, a plane containing that image of mask pattern which is in focus). In other words, a first exposure operation is performed in a state that the image plane of the mask pattern is formed at the top (or bottom) of the topography of a substrate surface or in the vicinity of the top (or bottom), and a second exposure operation is performed in a state that the image plane of the mask pattern is formed at the bottom (or top) of the topography or in the vicinity of the bottom (or top). In a case where a substrate surface has a highly-elevated topography (that is, a large difference in level), a third exposure operation is additionally performed in a state that the image plane of the mask pattern is formed at an intermediate position between the top and bottom of the topography.

DESCRIPTION OF THE PREFERRED EMBODIMENTS

It has been found by the inventors' investigation that the effective focal depth of an exposure optical system can be increased by overlapping a plurality of light beams having image points at different positions on an optical axis, and thus the image of a mask pattern can be formed accurately in a region between the top and the bottom of the topography of a substrate surface. The term "image point" indicates a point on the conjugate plane of the mask pattern with respect to the exposure optical system. Accordingly, when an exposure operation for exposing a substrate coated with a resist layer to exposure light through a mask is performed a plurality of times at different positional relations in the direction of the optical axis between the resist layer and the image plane of a mask pattern, or when exposure operations at the different positional relations are simultaneously performed, the image of the mask pattern can be accurately formed not only at the top and the bottom of the topography of a substrate surface but also at an intermediate position between the top and the bottom of the topography. Thus, a fine pattern can be formed accurately all over the topography.

Furthermore, according to the present invention, a plurality of positions on the optical axis which are separated from each other, are previously set, and the exposure operation is performed only when a reference plane in the substrate or the image plane of the mask pattern is placed at each of the above positions. Accordingly, unlike the conventional method, in which an exposure operation is performed in a state that a substrate vibrates in the direction of optical axis, there is no fear of a substrate surface receiving a large quantity of light in a state that the image plane of a mask pattern is formed in a region between the top and the bottom of the topography of the substrate surface, that is, light incident on the substrate surface in the above state does not exist, or is very little, if any. Hence, the image of mask pattern formed on the substrate surface is excellent in contrast, and thus a fine pattern can be formed accurately on a substrate surface having a highly-elevated topography.

Figure 1:
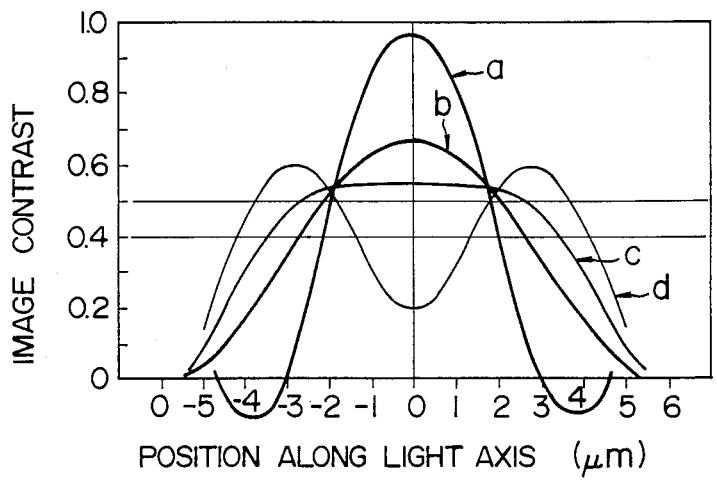
FIG. 1 is a graph for explaining the principle of the present invention.
Figure 2A:
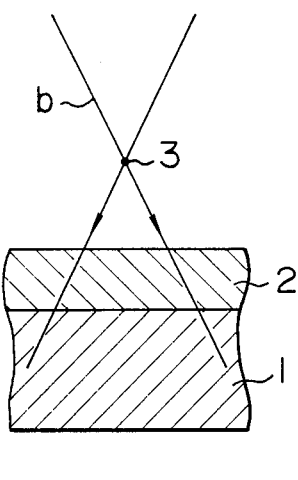
FIGS. 2a and 2b are sectional views showing the positional relations between a substrate and the image plane of a mask pattern according to the present invention.
Figure 2B:
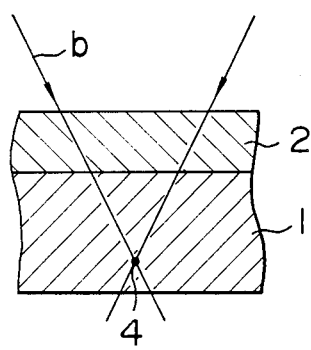

FIG. 1 shows relations between the distance on an optical axis and the image contrast at a plane perpendicular to the optical axis for a case where an exposure operation for exposing the substrate surface to exposure light through a mask having a mask pattern corresponding to a 0.7 $\mu$m line-and-space pattern to be formed on a substrate is performed only once, and for a case where the above exposure operation is performed twice in such a manner that the image plane of the mask pattern is formed at two positions in (or over) a substrate which are separated apart from each other in the direction of the optical axis. In FIG. 1, curve a indicates a case where the exposure operation is performed only once, and curves b, c and d indicate cases where the exposure operation is performed twice and the distance between two positions, at which the image plane of the mask pattern is formed, is made equal to 3 $\mu$m, 3.5 $\mu$m and 5 $\mu$m, respectively. Further, in FIG. 1, the origin on the optical axis is given by the intersection of the optical axis and that image plane of the mask pattern which is formed when the exposure operation is only once, or by the center between the intersections of the optical axis and those image planes of the mask pattern which are formed when the exposure operation is performed twice. When the exposure operation is performed twice in such a manner that an image point of a mask pattern is formed at different positions as shown in FIGS. 2a and 2b, the image contrast at a substrate surface becomes weaker as compared with a case where the exposure operation is performed only once, but can take a value greater than a predetermined value in a wide range in the direction of the optical axis. However, when the distance between the image planes of mask pattern formed in the above manner is made too large, the image contrast at the central plane between the image planes is lowered. Accordingly, by appropriately selecting the distance between the image planes, the image contrast exceeding a predetermined value can be obtained in a desired range in the direction of the optical axis. An increase in effective focal depth of an exposure optical system obtained by the present invention is determined by a resist material, a developer, a contrast enhancing material, and the lower limit of image contrast capable of delineating a desired pattern Referring to FIG. 1, in a case where the distance between the image planes of the mask pattern is made equal to 3.5 $\mu$m to obtain the curve c, when the lower limit of image contrast is equal to 0.5, the increase in effective focal depth of the exposure optical system is 45%. When the lower limit of image contrast is equal to 0.4, the increase in effective focal depth is about 70%. Further, when the exposure operation is performed three times in such a manner that the image plane of the mask pattern is formed at three different positions, the increase in effective focal depth is about 150%.

In order to delineate a pattern accurately on a resist film at the top and the bottom of the topography of a substrate surface existing in an exposure area, it is desirable to make an image contrast greater than a lower limit in a range in the direction of optical axis which is determined by the field curvature of projection lens, the flatness of the substrate surface and the distance between the top and the bottom of the topography of the substrate surface. It is needless to say that the lower limit of the image contrast is dependent upon a developing operation, an exposure method and others.

For example, in a case where a contrast enhancement lithographic method (namely, CEL operation) is used, the lower limit of image contrast is about 0.3, that is, a favorable resist pattern can be formed by making the image contrast greater than 0.3. In a case where a high-$\gamma$ resist such as the TSMR 8800 (trade name) manufactured by Tokyo Ohka Kogyo Co. Ltd. and having a $\gamma$-value of 3.0 or more is used, it is desirable to put the image contrast higher than 0.3 or 0.5. Further, in a case where an ordinary resist such as the MP 1300 (trade name) manufactured by Shipley Co is used, it is desirable to put the image contrast higher than 0.8 or 0.9. While, in the projection exposure method, the image contrast can be kept at a favorable level only in the vicinity of the image plane of a mask pattern, and the image contrast at a plane decreases abruptly when the distance between the plane and the image plane becomes large.

The image contrast which is obtained by performing an exposure operation a plurality of times in such a manner that the image plane of a mask pattern is formed at a plurality of positions in (or over) a substrate which are spaced apart from each other in the direction of an optical axis, is about the means value of image contrasts each obtained by one exposure operation. Accordingly, even in a case where it is impossible to obtain a desired image contrast in a predetermined range in the direction of the optical axis by one exposure operation, the desired image contrast can be obtained in the predetermined range by performing a plurality of exposure operations in such a manner that the image plane of the mask pattern are formed at a plurality of positions in (or over) the substrate which are spaced apart from each other in the direction of the optical axis.

EMBODIMENT I

An embodiment of the present invention will be explained below, with reference to FIGS. 2a and 2b.

As shown in FIG. 2a, a photoresist layer 2 is formed on a silicon substrate 1. Thereafter, the image of a mask pattern is formed on the photoresist layer by a projection aligner (not shown), and then the photoresist layer is developed. In the above, exposure is carried out in the following manner. Referring to FIG. 2a, a first exposure operation is performed in a state that an image point of a mask (not shown) due to light b is formed at a point 3 (hereinafter referred to as "first image point"). Then, a stage mounted with the substrate 1 is moved in the direction of an optical axis till the above image point reaches a position 4 in the substrate 1, as shown in FIG. 2b, and a second exposure operation is performed. The point 4 will hereinafter referred to as "second image point". Incidentally, the RA101HL-type reduction projection aligner manufactured by Hitachi Ltd., is used as the above projection aligner. In order to find effective focal depth, exposure was carried out for many values of the distance between the first image point 3 and the substrate 1 in the direction of the optical axis while fixing the distance between the first and second image points to 3.5 $\mu$m, and it was found that the positional range of the first image point capable of delineating a 0.7 $\mu$m line-and-space pattern accurately, that is, effective focal depth for this pattern was about 6 $\mu$m. While, the focal depth according to the conventional method, in which only one exposure operation was performed, was about 3.5 $\mu$m. That is, the present invention can increase the focal depth by about 70%.

Further, in a case where the substrate 1 had a topography at the surface thereof, when the distance between the top and the bottom of the topography exceeded about 1.6 $\mu$m, it was impossible to delineate the above pattern accurately by the conventional method. According to the present embodiment, even when the distance between the top and the bottom of the topography exceeded 4.0 $\mu$m, it was possible to delineate the pattern accurately. That is, according to the present embodiment, the above pattern can be formed accurately on a substrate surface having a topography three times higher than that allowed in the conventional method.

In the above embodiment, the TSMR 8800 (trade name) manufactured by Tokyo Ohka Kogyo Co. Ltd. was used for forming the photoresist layer 2. However, the photoresist layer is not limited to the TSMR 8800, but may be made of positive resist materials such as the MP 1400 (trade name) manufactured by Shipley Co., the OFPR 5000 (trade name) manufactured by Tokyo Ohka Kogyo Co. Ltd., and the AZ 1300 SFD (trade name) manufactured by Hochst A.G. Further, the photoresist layer may be made of negative resist materials belonging to the polyvinyl-phenol group such as the RD 2000 N (trade name) and the RU 1000 N (trade name) both manufactured by Hitachi Chemical Co. Ltd., or made of a negative resist material belonging to a cyclorubber group such as the CBR (trade name) manufactured by Japan Synthetic Rubber Co. Ltd. Further, in the present embodiment, a projection lens had a numerical aperture of 0.42, and an exposure wavelength was 365 nm. However, even when the projection lens had a different numerical aperture and the exposure wavelength had a different value, the remarkable effect of the present embodiment was obtained. Furthermore, in the present embodiment, the image plane of a mask pattern was formed at two different positions in (or over) the substrate by displacing the substrate in the direction of an optical axis. Alternatively, the image plane of the mask pattern may be formed at different positions by moving a reticle having a mask pattern in the direction of the optical axis, by introducing a transparent material different in refractive index from air into an exposure optical system, by changing the atmospheric pressure in the whole or a portion of the exposure optical system, by using a lens having a multiple focal point, by overlapping light beams from a plurality of exposure optical systems which form the image plane of a mask pattern in different planes, or by using different wavelengths or a continuous wavelength in the same exposure optical system.

EMBODIMENT II

A pattern is formed on a substrate by the wellknown, three-layer resist method. That is, an organic film, an inorganic film and a resist film are formed as the bottom, middle and top layers of a three layer structure on the substrate, respectively. The organic film serving as the bottom layer is formed in such a manner that the PB 3900 B (trade name) manufactured by Hitachi Chemical Co. Ltd. is applied on the substrate by spin coating, and then subjected to a heat treatment at about 200° C. Alternatively, the bottom layer may be formed of any one of various films which can be used as the bottom layer in the three-layer resist method such as a heat-treated ordinary resist film and a poly-imide film. The inorganic film serving as the middle layer is formed of an SiO₂ layer which is obtained by the SOG (spin on glass) method. Alternatively, the middle layer may be formed of any one of various films capable of acting as the middle layer in the three-layer resist method such as an SiO₂ film due to chemical vapor deposition, an SiO₂ film due to sputtering, an $SiN_x$ film due to plasma deposition and a $TiO_x$ film due to plasma deposition.

Next, as in the EMBODIMENT I, an exposure operation is performed twice in such a manner that the image plane of a mask pattern is formed at different positions, and then development is carried out to form a resist pattern in the top layer.

The cross-sectional profile of the resist pattern thus obtained is slightly rounded, as compared with that in a conventional method including only one exposure operation, but the resist pattern can act satisfactorily as a mask for patterning the inorganic film (namely, middle layer). Thus, a favorable final pattern can be formed without being affected by the rounded cross-sectional profile of the resist pattern. Similarly to the EMBODIMENT I, the focal depth in the present embodiment was about 1.8 times larger than the focal depth in the three-layer resist method using only one exposure operation. As mentioned above, in the present embodiment, the three-layer resist method is combined with the present invention to increase the focal depth without degrading the pattern formed in the bottom layer.

EMBODIMENT III

The photoresist layer in the EMBODIMENT I is coated with a well-known contrast enhancing material which is varied in light transmissivity when irradiated with ultraviolet rays so as to improve the image contrast at the material. Then, as in the embodiment I, an exposure operation is performed twice in such a manner that the image plane of a mask pattern is formed at different positions. According to the present embodiment, the roundness in the cross-sectional profile of resist pattern and a reduction in the remaining film thickness are greatly suppressed. Thus, in a wide range in the direction of an optical axis, the cross-sectional profile of a resist pattern and the remaining film thickness are substantially the same as in a case where a resist pattern is formed in the best focal position in a conventional method.

The cross-sectional profile of a resist pattern can be improved not only by the contrast enhancing material but also by a high-contrast process in which a high-contrast developer or high-contrast resist material is used.

According to the present embodiment, even when the distance between the first and second image points was made greater than 3.5 μm, the degradation of the cross-sectional profile of resist pattern and the reduction in the remaining film thickness were prevented by the contrast enhancement effect, and thus a practically usable pattern was formed in a wide range in a direction parallel to an optical axis. When the contrast enhancing method and the present invention were combined with the three-layer resist method, the focal depth, the dimensional accuracy and the cross-sectional profile of resist pattern were further improved, and a favorable pattern was formed.

Further, when the exposure operation was performed three times in such a manner that the image plane of a mask pattern was formed at three different positions which were disposed at intervals of 3.5 μm along the optical axis, the effective focal depth was about 2.5 times larger than that in the conventional method. The multiple exposure, in which the image plane of a mask pattern was formed at a plurality of different positions, was very effective for isolated transparent portion of a mask such as a hole (or aperture) pattern and a groove pattern (space pattern), and improved the focal depth specifically in these cases.

The present invention was used for various mask patterns, and it was found that the focal depth was made largest by making the distance between the first and second image points nearly equal to a focal depth in the conventional method.

In the conventional method, the focal depth is dependent upon the feature size and shape of a mask pattern. Accordingly, the optimum distance between the first and second image points in the present invention is not limited to the values mentioned in the EMBODIMENTS I and III, but varies with the feature size of the mask pattern, and thus the most favorable result will be obtained by making the distance between the first and second image points nearly equal to a most severe focal depth.

The CEL (contrast enhancement lithographic) method using a contrast enhancing material is described in the IEEE Electron Device Letter, Vol. EDL-4, No. 1, January, 1983, pages 14 to 18.

According to the present invention, in a case where two patterns (for example, contact holes) independent of each other are formed at the top and the bottom of a topography, an exposure operation is performed in a state that the image plane of a mask is formed at one of the top and the bottom of the topography, and then another exposure operation is performed in a state that the image plane is formed at the other. When an exposure operation is performed in a state that the image plane of the mask is formed at one of the top and the bottom of the topography, the other is also illuminated with exposure light, but light incident upon the other is out of focus and does not disturb the formation of pattern at the topography. In this case, the difference in height between the top and the bottom of the topography and the distance between the first and second image points are not subject to special limitations.

Accordingly, a fine pattern can be accurately formed at the top and the bottom of a highly-elevated topography, though it is impossible to obtain such an accurate pattern by the conventional method. However, in a case where a continuous pattern is formed between the top and the bottom of a topography, for example, a wiring pattern is extended from the surface of a thick insulating film formed on a substrate surface to the substrate surface, when the distance between the first and second image points in a direction parallel to an optical axis is made too large, the image contrast at a region corresponding to the center between the first and second image points is decreased to a marked degree, as indicated by a curve d in FIG. 1, and thus it becomes very difficult to form a favorable pattern. Accordingly, in a case where the difference in height between the top and the bottom of a topography is so large that it is obliged to perform an exposure operation twice in such a manner that the image plane of a mask pattern is formed at different positions which are spaced apart from each other a long distance, it is preferable to increase the number of exposure operations and to shorten the distance between the different positions, that is, the distance between adjacent image points. The distance between adjacent image points for obtaining a favorable result is dependent upon the optical condition such as numerical aperture, exposure wavelength, the kind of resist material used, a developing condition, and the feature size of a pattern to be formed. However, when the distance between adjacent image points is made less than about 3.5 μm, a fine pattern having a line width of 0.5 μm or less can be formed accurately on a substrate surface having a highly-elevated topography. When the distance between adjacent image points is made too small, the effect of the present invention is lost. Accordingly, it is desirable to make the distance between adjacent image points greater than or equal to 1 μm. Preferably, the distance between adjacent image points is put in a range from 1 to 3.5 μm.

EMBODIMENT IV

Figure 3:
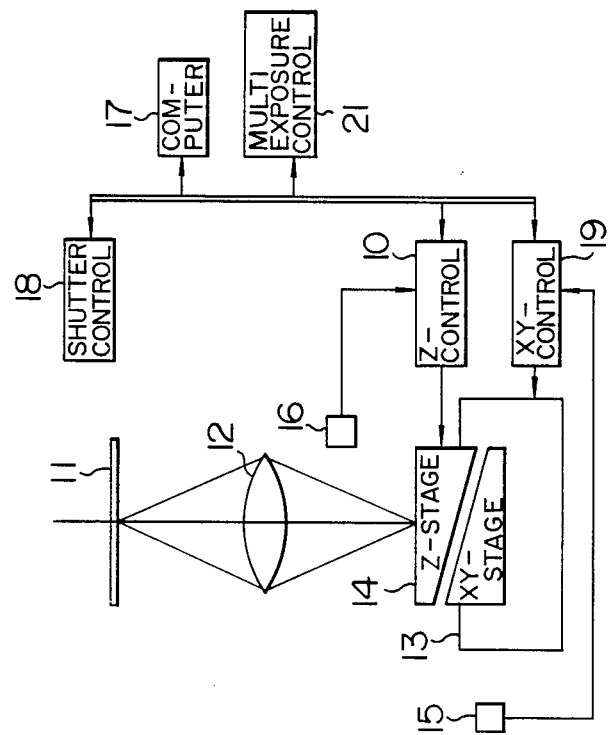
FIG. 3 is a block diagram showing an example of a projection aligner according to the present invention.

FIG. 3 shows an embodiment of a projection aligner according to the present invention. Referring to FIG. 3, the present embodiment is made up of a reticle 11, an optical system 12 for projection, a substrate stage including an X-Y stage 13 and a Z-stage 14 (where a Z-direction is parallel to the optical axis of the present embodiment, and X- and Y-directions are defined in a plane perpendicular to the optical axis), an X-Y sensor 15 for detecting the position of the X-Y stage 13, a Z-sensor 16 for detecting the position of the Z-stage 14, a control system for controlling the whole of the present embodiment, and various elements used for operating an ordinary projection aligner. The control system includes a computer 17 for controlling various operations in the present embodiment, a shutter control system 18 for opening and shutting an exposure shutter on the basis of a command from the computer 17, an X-Y stage control system 19 for moving the X-Y stage to a specified position, a Z-stage control system 10 for moving the Z-stage to a specified position, and a multi-image using exposure control system 21 for instructing the movement of a substrate in the direction of the optical axis and for issueing a command to the shutter control system 18. The computer 17 and the systems 18, 19, 10 and 21 are connected to one another through a bus.

Figure 4:
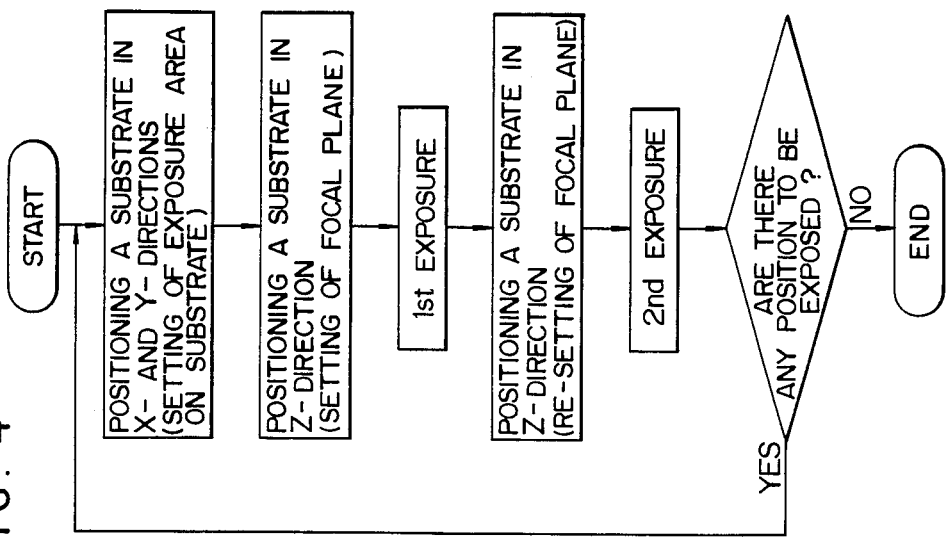
FIG. 4 is a flow chart for explaining the operation of the projection aligner of FIG. 3.

Exposure areas on a substrate and an exposure mode for each exposure area are previously stored in the computer 17. The term "exposure mode" means the number of positional relations between a substrate and the image plane of the reticle 11 which are used in performing a plurality of exposure operations for the same position on the substrate, the position of the image plane on the optical axis, and the quantity of light incident on the image plane at each positional relation. In a case where the exposure modes for a plurality of exposure areas indicate the use of a single positional relation between the substrate and the image plane, the computer 17 performs an exposure operation for the exposure areas in accordance with the ordinary step and repeat method. In a case where the exposure mode for an exposure area indicates the use of two or more positional relations, the computer 17 drives the X-Y stage 13 through the control system 19 so that the above exposure area of the substrate is moeved to the exposure position of the present embodiment, and then exposure operations are performed in accordance with an exposure sequence given by the multi-image using exposure control system 21. FIG. 4 shows the operation sequence of the present embodiment for a case where two positional relations between the substrate and the image plane are used at every exposure area.

Figure 5A:
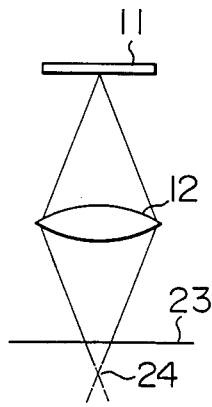
FIGS. 5a and 5b are schematic diagrams showing exposure operations which are performed at different positional relations between a substrate and the image plane of a mask pattern in accordance with the present invention.
Figure 5B:
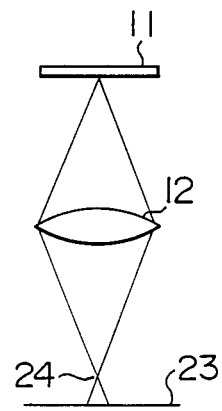
Figure 6A:
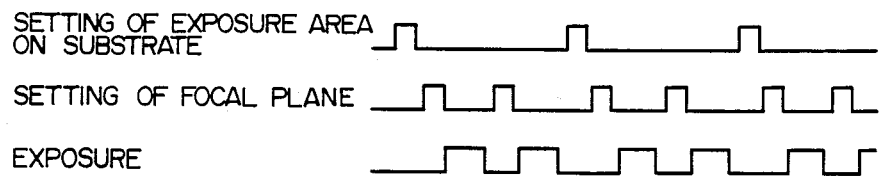
FIGS. 6a and 6b are timing charts for explaining the double exposure operation according to the present invention and a single exposure operation according to a conventional method.
Figure 6B:
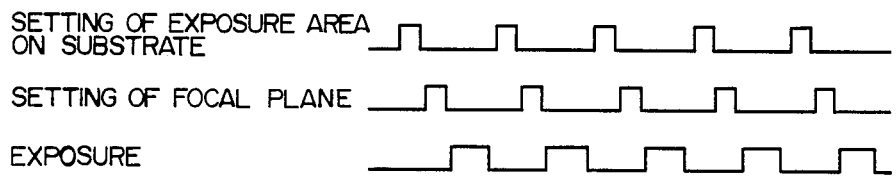

Next, the operation of the present embodiment will be explained, with reference to FIG. 4. The multi-image using exposure control system 21 drives the Z-stage 14 so that the substrate 23 is disposed for an image point 24 (of the reticle 11) as shown in FIG. 5a. At this time, the substrate is moved in the X- and/or Y-direction with the movement of the Z-stage. However, the movement of the substrate in the X- and/or Y-direction is fedback to the X-Y stage control system 19 with the aid of the X-Y sensor 15, and thus the X-Y stage 13 is moved so as to compensate the movement of the substrate in the X- and/or Y-direction. That is, the substrate is moved only in the direction of the optical axis. When it is confirmed that the substrate is located accurately at a specified position, the multi-image using exposure control system 21 instructs the shutter control system 18 to perform a first exposure operation for a period which is specified for the above positional relation between the substrate and the image point. After it has been confirmed that the first exposure operation is completed, the multi-image using exposure control system 21 again moves the substrate in the direction of the optical axis so that the substrate 23 is disposed for the image point 24 as shown in FIG. 5b. Then, a second exposure operation is performed. In a case where three or more positional relations between the substrate and the image point (that is, image plane) are used, an exposure operation is performed each time one of the positional relations is set. When the above processing for an exposure area on the substrate is completed, the computer 17 drives the X-Y stage 13 so that the next exposure area on the substrate is placed at the exposure position of the present embodiment. FIG. 6a is a timing chart showing the above sequence. As mentioned above, the multi-image using exposure control system 21 moves the substrate in the Z-direction and performs an exposure operation a plurality of times, each time the substrate is moved in the X- and Y-directions to reach the exposure position of the present embodiment. FIG. 6b shows a case where an exposure operation for every exposure area is performed only at a single positional relation between the substrate and the image plane of the reticle, by way of reference. In a conventional apparatus, an exposure operation is performed only in the sequence of FIG. 6b.

In the above explanation, an exposure operation is performed after the Z-stage has been moved in the direction of the optical axis. However, the multi-image using exposure control system 21 can carry out the exposure operation and the movement of the Z-stage at the same time.

Further, in the above explanation, after a plurality of exposure operations have been performed for an exposure area on a substrate, the control system of the embodiment moves the next exposure area on the substrate to the exposure position of the present embodiment. However, in case where the same exposure mode is applied to all the exposure areas on the substrate, it is not required to carry out the exposure processing in the above sequence. For example, a substrate surface is spaced from the image plane of the reticle by −2 μm in the direction of the optical axis, and then the exposure operation is performed for all the exposure areas on the substrate surface by the step and repeat method. Then, the substrate surface is spaced from the image plane by +2 μm in the direction of the optical axis, and the exposure operation is again performed for all the exposure areas. It is needless to say that the substrate is fixed to the Z-stage during the above processing.

The images of a lattice pattern having a period of 1 μm and an aperture pattern having a diameter of 0.5 μm were formed on each of substrates having surface topographies different in height. According to a conventional method, in which an exposure operation was performed only at one positional relation between the substrate and the image plane of the reticle, the images of the above patterns were delineated accurately at the top and the bottom of a topography, provided that the difference in height between the top and the bottom of the topography was less than 0.5 μm. While, according to the present embodiment, an exposure operation was performed twice in such a manner that the image of the reticle was formed at two positions which were disposed so as to sandwich the surface of a resist film therebetween and were spaced apart from each other a distance of 3 μm in the direction of the optical axis. In this case, the images of the patterns were delineated accurately at the top and the bottom of a topography having a height of 2 μm. Further, for the above aperture pattern, the image of the aperture pattern was delineated accurately at the top and the bottom of a topography having a height of 10 μm, by disposing the substrate at three positions which were appropriately set at intervals of 3 μm in the direction of the optical axis and by performing an exposure operation in a state that the substrate was disposed at each of the above positions.

The effect exhibited by the present embodiment is further enhanced by using the multi-layer resist method, a high-contrast developer, a high-contrast resist material, and a contrast enhancing material. In the present embodiment, the positional relation between the substrate and the image plane of the reticle is varied by moving the substrate stage in the direction of the optical axis. However, the present invention is not limited to the above method, but can use other methods. For example, the distance between a reference plane in the substrate and the image plane of the reticle may be varied by changing the pressure of a gas which is introduced into a hermetically sealed region formed between a pair of lenses, or by moving the reticle or a lens in the direction of the optical axis.

Further, when a projection aligner using an excimer laser as a light source was provided with the multi-image using a exposure control system, the effective focal depth was increased as in a case when a projection aligner using ultraviolet rays such as the i-line, the g-line, etc. carries out a multi-image using exposure method. Thus, a problem peculiar to an excimer laser projection aligner that the focal depth was insufficient, was solved.

Further, when the optical system for exposure was formed of a telecentric system, the change in reduction ratio caused by varying the position of the image plane of the reticle was eliminated, and thus the dimensional accuracy of a pattern was improved all over the surface of a semiconductor chip.

EMBODIMENT V

Another embodiment of a projection aligner according to the present invention is different from the embodiment described in the EMBODIMENT IV, in that a flat plate or lens which is different in refractive index from air and made of a transparent meterial for an exposure wavelength, is inserted into and withdrawn from the optical system. The thickness and refractive index of the flat plate (or lens) and the inclination of the flat plate (or lens) to the optical axis are set or adjusted so that when the flat plate (or lens) is inserted into the optical system, the image plane of the reticle is moved in the direction of the optical axis by a predetermined distance. Further, in the present embodiment, a plurality of flat plates (or lenses) which are different in thickness and refractive index from each other, can be inserted into the optical system, and thus the position of the image plane can be varied by inserting all or some of the flat plates (or lenses) into the optical system. The insertion of the flat plate (or lens) into the optical system and the withdrawal of the flat plate (or lens) from the optical system are controlled by the multi-image using exposure control system described in the EMBODIMENT IV. Accordingly, exposure can be made in the following manner. That is, an exposure operation for an exposure area is interrupted, and the flat plate (or lens) is inserted into the optical system to change the position of the image plane of the reticle. The same experiments as described in the EMBODIMENT IV were done by using the present embodiment, and it was confirmed that the same results as in the EMBODIMENT IV were obtained by the present embodiment.

EMBODIMENT VI

A further embodiment of a projection aligner according to the present invention is different from the embodiment described in the EMBODIMENT IV, in that the optical system for exposure is disposed, as a whole, in a hermetically sealed vessel, and the pressure within the hermetically sealed vessel can be changed rapidly to a desired value. Thus, exposure can be made in the following manner. That is, an exposure operation for an exposure area is interrupted, and the pressure within the hermetically sealed vessel is rapidly varied. Then, the exposure operation for the above exposure area is again started. Thus, the position of the image plane of the reticle is different between a period before the interruption and a period after the interruption. The pressure within the hermetically sealed vessel is controlled by the multi-image using exposure control system described in the EMBODIMENT IV. The same patterns as described in the EMBODIMENT IV were formed by the present embodiment, and it was confirmed that the same results as in the EMBODIMENT IV were obtained by the present embodiment.

As is evident from the above explanation, according to the present invention, the effective focal depth in the projection exposure method can be increased. Accordingly, even when a projection lens having a large numerical aperture and producing a field curvature is used and the topography of a substrate surface has a large difference in height between the top and the bottom thereof, a fine pattern can be formed accurately on the substrate surface. An increase in focal depth due to the present invention is dependent upon the lower limit of image contrast capable of delineating a desired pattern, and the above lower limit varies with the material and process used. In a case where an exposure operation is performed at two positional relations between a substrate and the image plane of a mask pattern in accordance with the present invention, the focal depth is about 70% larger than that in a conventional method. Further, in a case where an exposure operation is performed at three positional relations between the substrate and the image plane of the mask pattern, the focal depth is about 150% larger than that in the conventional method. Further, when the contrast enhancement lithographic method and a high-γ photoresist material are used to enhance the image control, the present invention can produce more favorable result.

Furthermore, even when a photoresist material showing the reciprocity law failure is used, the present invention can produce favorable results. In this case, a change in solubility of the photoresist caused by incident light is not proportional to the quantity of light incident on the photoresist material. That is, a change in solubility of the photoresist material caused by an incident light quantity less than a threshold value, is very small, and thus a sharp contrast can be obtained by the above photoresist material.

We claim:

1. A method of forming a pattern, comprising the steps of:
   exposing a desired portion of a photoresist film in accordance with a mask pattern by a reduction projection aligner to change the solubility of the exposed portion, the photoresist film being formed on a surface of a semiconductor substrate, the surface of the substrate having a topography, an exposure operation for exposing the desired portion of the photoresist film being performed in such a manner that a plurality of reduced images of the same mask pattern are formed at a plurality of different positions spaced apart from each other in the direction of the optical axis of the reduction projection aligner; and
   developing the photoresist film to form a pattern of the photoresist film.

2. A method of forming a pattern, as claimed in claim 1, wherein the exposure operation is performed a plurality of times in such a manner that the substrate is disposed at a plurality of positions spaced apart from each other in the direction of the optical axis of the reduction projection aligner.

3. A method of forming a pattern, as claimed in claim 1, wherein the exposure operation is performed twice.

4. A method of forming a pattern as claimed in claim 1, wherein the exposure operation is performed is three times.

5. A method of forming a pattern, as claimed in claim 1, wherein the distance between adjacent ones of the plural positions lies in a range from 1 to 3.5 μm.

6. A method of forming a pattern, as claimed in claim 1, wherein the surface of the substrate having a topography is an uneven surface, and the exposure operation is performed in such a manner that the image of the mask pattern is formed at a plurality of different spaced apart positions from each other and from a reference plane in the substrate along the same optical axis of the reduction projection aligner.

7. A method of forming a pattern, as claimed in claim 1, wherein the image of a mask pattern is formed at a plurality of different positions spaced apart from each other and from a reference plane in the substrate along the same optical axis of the reduction projection aligner.

8. A method of forming a pattern as claimed in claim 1, wherein the exposure operation for exposing the desired portion of the photoresist film including a region between a top and a bottom of the topography is performed so that the reduced images formed at a plurality of different positions spaced apart from each other are formed on the photoresist film continuously from the top of the topography to the bottom thereof.

9. A method of forming a pattern as claimed in claim 1, wherein the exposure operation is performed a plurality of times in such a manner that the substrate is disposed at a plurality of stationary positions spaced apart from each other in the direction of the optical axis of the reduction projection aligner.

* * * * *